(12) United States Patent
Luo et al.

(10) Patent No.: US 12,514,043 B2
(45) Date of Patent: Dec. 30, 2025

(54) DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Wei Luo, Hubei (CN); Yingchuan Jiang, Hubei (CN); Wenxu Xianyu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 713 days.

(21) Appl. No.: 17/759,204

(22) PCT Filed: Jun. 6, 2022

(86) PCT No.: PCT/CN2022/097139
§ 371 (c)(1),
(2) Date: Jul. 21, 2022

(87) PCT Pub. No.: WO2023/226079
PCT Pub. Date: Nov. 30, 2023

(65) Prior Publication Data
US 2024/0297280 A1    Sep. 5, 2024

(30) Foreign Application Priority Data

May 25, 2022   (CN) .......................... 202210580391.3

(51) Int. Cl.
*H10H 20/857*   (2025.01)
*H01L 25/16*    (2023.01)

(52) U.S. Cl.
CPC ......... *H10H 20/857* (2025.01); *H01L 25/167* (2013.01)

(58) Field of Classification Search
CPC ........................ H10K 59/131; H10H 20/857
See application file for complete search history.

(56) References Cited

U.S. PATENT DOCUMENTS

2010/0213485 A1   8/2010   Mckenzie et al.
2012/0193656 A1*  8/2012   Tseng ............... G02F 1/136227
                                              257/E33.012
(Continued)

FOREIGN PATENT DOCUMENTS

CN    102138216 A    7/2011
CN    105182642 A    12/2015
(Continued)

OTHER PUBLICATIONS

Chinese Office Action issued in corresponding Chinese Patent Application No. 202210580391.3 dated Apr. 25, 2024, pp. 1-7.
(Continued)

*Primary Examiner* — Britt D Hanley
*Assistant Examiner* — Jason James Greaving (57) ABSTRACT

A display device is disclosed and includes: a luminescent substrate, wherein the luminescent substrate includes a substrate, a first conductive part, and a luminescent device, and the first conductive part is disposed on a second surface of the substrate; and a driving substrate, wherein a surface of the driving substrate close to the luminescent substrate is provided with a second conductive part connected to the first conductive part. One of the first conductive part or the second conductive part includes a line-shaped recess. The other one of the first conductive part or the second conductive part includes a dot-shaped protrusion. The dot-shaped protrusion is defined in the line-shaped recess.

20 Claims, 6 Drawing Sheets

(56) References Cited

U.S. PATENT DOCUMENTS

2017/0358637 A1\* 12/2017 Lee .................... G06F 3/0446
2019/0019928 A1    1/2019 Li et al.

FOREIGN PATENT DOCUMENTS

| CN | 108511507 | A |   | 9/2018  |         |             |
|----|-----------|---|---|---------|---------|-------------|
| CN | 109791335 | A |   | 5/2019  |         |             |
| CN | 110120408 | A |   | 8/2019  |         |             |
| CN | 111105720 | A |   | 5/2020  |         |             |
| CN | 111653608 | A |   | 9/2020  |         |             |
| CN | 112017550 | A |   | 12/2020 |         |             |
| CN | 112859460 | A | * | 5/2021  | ........ | G02F 1/13458 |
| CN | 113451365 | A |   | 9/2021  |         |             |
| CN | 113540170 | A | * | 10/2021 | ........ | G02F 1/13336 |
| CN | 113848664 | A |   | 12/2021 |         |             |
| CN | 114220807 | A |   | 3/2022  |         |             |
| CN | 114388597 | A |   | 4/2022  |         |             |
| JP | 2007280964 | A |   | 10/2007 |         |             |
| KR | 20180025767 | A | * | 3/2018  |         |             |
| WO | WO 2021 010079 | A1 | * | 1/2021 | ........ | H01L 24/95 |

OTHER PUBLICATIONS

Chinese Office Action issued in corresponding Chinese Patent Application No. 202210580391.3 dated Nov. 12, 2023, pp. 1-6.
International Search Report in International application No. PCT/CN2022/097139,mailed on Dec. 19, 2022.
Written Opinion of the International Search Authority in International application No. PCT/CN2022/097139,mailed on Dec. 19, 2022.

\* cited by examiner

→ third direction

DISPLAY DEVICE

FIELD

The present disclosure relates to a field of display technologies, and more particularly, to a display device.

BACKGROUND

Nowadays, to realize frameless displays, it is necessary to dispose at least part of a circuit of a display panel on a driving substrate and then combine a luminescent substrate provided with a luminescent device with the driving substrate. However, when an assembly deviation between the luminescent substrate and the driving substrate is relatively great, the luminescent device of the luminescent substrate and a driving circuit disposed on the driving substrate cannot be effectively connected to each other, leading to display abnormality occurring on display devices.

Therefore, it is necessary to provide a technical solution to solve an issue of display abnormality due to relatively great assembly deviation between a luminescent substrate and a driving substrate.

SUMMARY

An objective of the present disclosure is to provide a display device to solve an issue of display abnormality due to relatively great assembly deviation between a luminescent substrate and a driving substrate.

The present disclosure provides a display device, comprising:
  a luminescent substrate, wherein the luminescent substrate comprises a substrate, a plurality of first conductive parts, and a plurality of luminescent devices, the substrate comprises a first surface and a second surface opposite to the first surface, the luminescent devices are disposed on the first surface of the substrate, the first conductive parts are spaced apart from each other and are disposed on the second surface of the substrate, the first conductive parts are electrically connected to the luminescent devices, and the substrate is a flexible substrate;
  a driving substrate, wherein the driving substrate is disposed on a backside of a light-emitting surface of the luminescent substrate, a surface of the driving substrate close to the luminescent substrate is provided with a driving circuit and a plurality of second conductive parts connected to the driving circuit and spaced apart from each other, and the second conductive parts are connected to the first conductive parts;
  wherein one of the first conductive parts or the second conductive parts comprise a line-shaped recess, the other one of the first conductive parts or the second conductive parts comprise a dot-shaped protrusion, the dot-shaped protrusion is defined in the line-shaped recess, and a gap is defined between the dot-shaped protrusion and a lateral wall of the line-shaped recess extending along an extension direction of the line-shaped recess.

In some embodiments, wherein the line-shaped recess extends along a single direction.

In some embodiments, the plurality of luminescent substrates are spliced to each other, and the plurality of line-shaped recesses have a same extension direction.

In some embodiments, the line-shaped recess comprises a first line-shaped recess and a second line-shaped recess intersecting with the first line-shaped recess, the first line-shaped recess extends along a first direction, the second line-shaped recess extends along a second direction, and the first direction intersects the second direction.

In some embodiments, the plurality of luminescent substrates are spliced to each other along a third direction, and one of the first direction or the second direction is parallel to the third direction;
  the plurality of luminescent substrates are spliced to each other along a third direction and a fourth direction, the third direction intersects the fourth direction, the third direction is parallel to the first direction, and the fourth direction is parallel to the second direction; or
  the plurality of luminescent substrates are spliced to each other along a third direction and a fourth direction, the third direction intersects the fourth direction, the first direction intersects both the third direction and the fourth direction, and the second direction intersects both the third direction and the fourth direction.

In some embodiments, the first line-shaped recess and the second line-shaped recess form an X shape, a crisscross shape, or a T-shaped intersection.

In some embodiments, one of the first conductive parts or the second conductive parts comprise a frame body and a conductive layer, at least part of the conductive layer is formed on a bottom of an opening of the frame body, and the opening and the conductive layer disposed in the opening form the line-shaped recess.

In some embodiments, material of the frame body comprises organic material, material of the conductive layer comprises metal or transparent conductive material, and material of dot-shaped protrusion comprises organic conductive material.

In some embodiments, a height of the dot-shaped protrusion is greater than or equal to 10 µm and is less than or equal to 100 µm, a depth of the dot-shaped recess is greater than or equal to 10 µm or is less than or equal to 100 µm.

In some embodiments, a size of the line-shaped recess along an extension direction of the line-shaped recess is greater than or equal to 50 µm or is less than or equal to 200 µm.

In some embodiments, the substrate is a flexible substrate.

In some embodiments, a gap is defined between the dot-shaped protrusion and a lateral wall of the line-shaped recess extending along an extension direction of the line-shaped recess.

Regarding the beneficial effects:
  the present disclosure provides a display device. A luminescent substrate comprises a plurality of first conductive parts spaced apart from each other and disposed on a back surface of the luminescent substrate. A plurality of second conductive parts are spaced apart from each other and are disposed on a surface of a driving substrate close to the luminescent substrate. The second conductive parts are connected to the first conductive parts. One of the first conductive parts or the second conductive parts comprise a line-shaped recess, and the other one of the first conductive parts or the second conductive parts comprise a dot-shaped protrusion. When the luminescent substrate is connected to the driving substrate, a position of the dot-shaped protrusion defined in the line-shaped recess is adjustable, thereby ensuring that the first conductive parts can be aligned with and conductive with the second conductive parts. As such, the display device can display normally.

DETAILED DESCRIPTION

Hereinafter preferred embodiments of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

Figure 1:
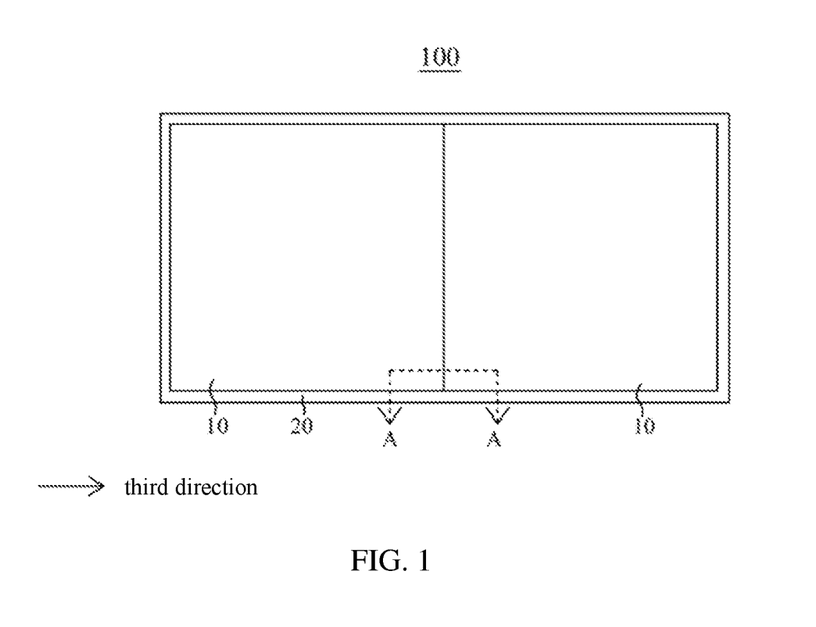
FIG. 1 is a schematic plan view showing a display device according to one embodiment of the present disclosure.
Figure 2:
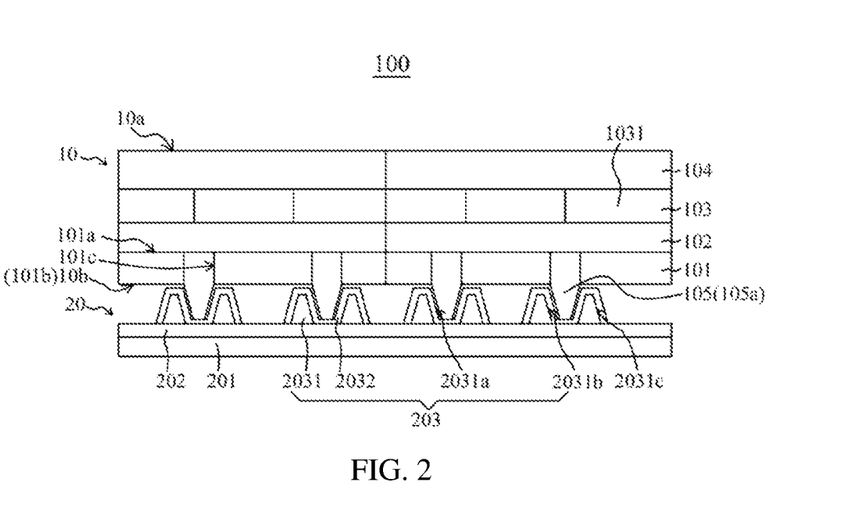
FIG. 2 is a cross-sectional schematic view showing the display device in FIG. 1 taken along a tangent line A-A.

Please refer to FIG. 1 and FIG. 2. The present disclosure provides a display device 100. The display device 100 is a transparent display device. The display device 100 includes a luminescent substrate 10 and a driving substrate 20. The luminescent substrate 10 includes a light-emitting surface 10a and a back surface 10b opposite to the light-emitting surface 10a. The driving substrate 20 is disposed on a backside of the light-emitting surface 10a of the luminescent substrate 10.

A number of the driving substrate 20 is one. A number of the luminescent substrate 10 is two. The two luminescent substrates 10 are spliced to each other along a third direction. The two spliced luminescent substrates 10 are connected to the driving substrates 20. It should be understood that the number of the luminescent substrate 10 may be one, two, or more.

A transparent optically clear adhesive is disposed between the spliced luminescent substrates 10 and the driving substrate 20, thereby preventing dust or moisture from entering a gap between the luminescent substrates 10 and the driving substrate 20.

The luminescent substrate 10 is a flexible light-emitting diode (LED) substrate. It should be understood that the luminescent substrate 10 may also include a micro LED, a mini LED, or a quantum dot LED.

Please refer to FIG. 2, the luminescent substrate 10 includes a substrate 101, a first driving circuit layer 102, a luminescent device layer 103, an encapsulation layer 104, and a plurality of first conductive parts 105 spaced apart from each other.

The substrate 101 includes a first surface 101a and a second surface 101b which are opposite to each other. The second surface 101b is the back surface 10b of the luminescent substrate 10. The first surface 101a and the second surface 101b are flat. The substrate 101 includes a connecting hole 101c. The connecting hole 101c penetrates the substrate 101 along a thickness direction of the substrate 101. The substrate 101 is a flexible substrate. Material of the substrate 101 is transparent polyimide or transparent polyethylene terephthalate.

The first driving circuit layer 102 is disposed on the first surface 101a of the substrate 101. The first driving circuit layer 102 includes a plurality of pixel driving circuits. The pixel driving circuits include a transistor and a capacitor.

The luminescent device layer 103 is disposed on a surface of the first driving circuit layer 102 away from the substrate 101. The luminescent device layer 103 includes a plurality of luminescent devices 1031. The luminescent devices 1031 are electrically connected to the pixel driving circuits. The luminescent device 1031 is an organic light-emitting diode.

The encapsulation layer 104 is disposed on a surface of the luminescent device layer 103 away from the first driving circuit layer 102. The encapsulation layer 104 includes two inorganic insulating layers and an organic insulating layer disposed between the two inorganic insulating layers.

The first conductive parts 105 spaced apart from each other are disposed on the second surface 101b of the substrate 101. The first conductive parts 105 are electrically connected to the pixel driving circuits by the connecting hole 101c. The first conductive parts 105 are electrically connected to the luminescent device 1031.

It should be noted that the luminescent substrate 10 includes the substrate 101, and the luminescent substrate 10 is stripped off from a glass substrate after the glass substrate is manufactured. However, the substrate 10 is flexible. Therefore, when the luminescent substrate 10 is stripped off from the glass substrate, part of the luminescent substrate 10 will be stretched and/or shrunk due to release of applied forces. Consequently, the first conductive parts 105 deviate from their original position.

In addition, to realize a frameless display by using one luminescent substrate 10 or by splicing multiple luminescent substrates 10 with each other, a driving circuit of a frame area of conventional display panels is disposed on the driving substrate 20. The luminescent substrate 10 is connected to the driving substrate 20, thereby making the driving substrate 20 drive the luminescent substrate 10 to emit light.

The driving substrate 20 includes a carrier board 201, a second driving circuit layer 202, and a plurality of second conductive parts 203 spaced apart from each other.

The carrier board 201 is a glass substrate. A surface of the carrier board 201 close to the luminescent substrate 10 is flat. A surface of the carrier board 201 close to the luminescent substrate 10 is provided with the second driving circuit layer 202. The second driving circuit layer 202 includes driving circuits such as a gate driving circuit and a power line. The second conductive parts 203 are disposed on a surface of the second driving circuit layer 202 away from the carrier board 201. The second conductive parts 203 are electrically connected to the second driving circuit layer 202. The second conductive parts 203 are connected to the first conductive parts 105. The second conductive parts 203 and the first conductive parts 105 transmit signals to the pixel driving circuits of the first driving circuit layer 102.

The first conductive parts 105 include a dot-shaped protrusion 105a. The second conductive parts 203 include a line-shaped recess 2031a. The line-shaped recess 2031a is line-shaped. The dot-shaped protrusion 105a is dot-shaped with respect to the entire line-shaped recess 2031a. When the dot-shaped protrusion 105a is defined in the line-shaped recess 2031a, the dote-shaped protrusion 105a may be defined on many different positions (two or more) in the line-shaped recess 2031a, thereby making the first conductive parts 105 be shifted due to stretch and/shrink of the flexible substrate 101. Furthermore, when the first conductive parts 105 and the second conductive parts 106 need to be connected to each other, the dot-shaped protrusion 105a can be moved to a certain position in the line-shaped recess 2031a, thereby ensuring that the first conductive parts 105 and the second conductive parts 203 can be well conductive with each other. Therefore, a conventional issue of poor conduction due to assembly deviation between a connecting structure on a side of a luminescent substrate and a connecting structure on a side of a driving substrate can be solved.

It should be understood that it is also allowable that the first conductive parts 105 include the line-shaped recess 2031a, and the second conductive parts 203 include the dot-shaped protrusion 105a.

An area of a cross-section of the second surface 101b of the dot-shaped protrusion 105a parallel to the substrate 101 is decreasingly decreased from a direction close to the substrate 101 to a direction away from the substrate 101. That is, a size of an end of the dot-shaped protrusion 105a away from the substrate 101 is less than a size of an end of the dot-shaped protrusion 105a close to the substrate 101. Therefore, the first conductive parts 105 can be stably disposed on the second surface 101b of the substrate 101, which allows the dot-shaped protrusion 105a to be easily moved in the line-shaped recess 2031a.

Specifically, the dot-shaped protrusion 105a is prismatic and may be a four prism or a circular cone. It should be understood that the dot-shaped protrusion 105a may also be cuboid.

A height of the dot-shaped protrusion 105a is greater than or equal to 10 μm and is less than or equal to 100 μm. For example, the height may be 20 μm, 40 μm, 50 μm, 60 μm, 70 μm, or 80 μm.

Material of the dot-shaped protrusion 105a includes organic conductive material. The organic conductive material includes a conductive silver adhesive. When the material of the dot-shaped protrusion 105a includes the organic conductive material, the dot-shaped protrusion 105a may be manufactured by printing processes.

Figure 3:
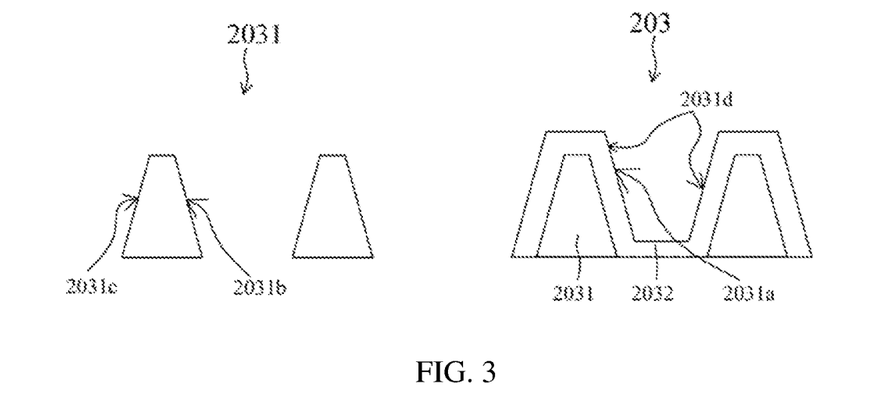
FIG. 3 is a partly enlarged schematic view showing a second conductive part of a driving substrate and a frame body of the second conductive part in FIG. 2.
Figure 6:
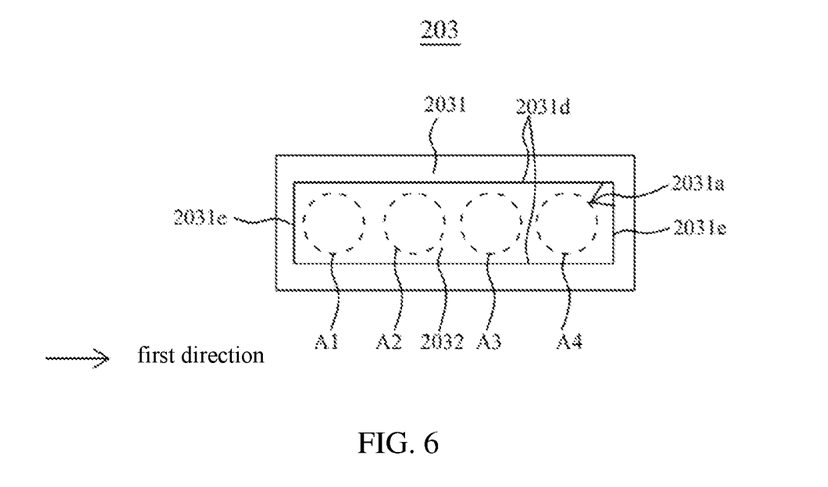
FIG. 6 is a schematic plan view showing a second conductive part of the driving substrate in FIG. 4 and FIG. 5.

Please refer to FIG. 2, FIG. 3, and FIG. 6, the second conductive parts 203 include a frame body 2031 and a conductive layer 2032. The frame body 2031 includes an opening 2031b penetrating the frame body 2031 along a thickness direction of the second conductive parts 203. The opening 2031b is located on a middle of the frame body 2031. Material of the frame body 2031 includes organic material or inorganic material. Material of the conductive layer 2032 includes metal or transparent conductive material.

At least part of the conductive layer 2032 is formed on a bottom of the opening 2031b of the frame body 2031. The conductive layer 2032 does not totally fill the opening body 2031b of the frame body 2031. The opening 2031b and the conductive layer 2032 located in the opening 2031b form the line-shaped recess 2031a.

Specifically, the conductive layer 2032 is formed on a lateral wall of the opening 2031b of the frame body 2031 and is formed on the second driving circuit layer 202 in the opening 2031b. In addition, the conductive layer 2032 extends from the lateral wall of the opening 2031b (an inner wall of the frame body 2031) to an external wall 2031c of the frame body 2031. The external wall 2031c of the frame body 2031 is defined on an exterior of the frame body 2031.

It should be understood that it is also allowable that the conductive layer 2032 is only disposed on the second driving circuit layer 202 in the opening 2031b. Meanwhile, the conductive layer 2032 is only formed on the bottom of the opening 2031b.

When the dot-shaped protrusion 105a is defined in the line-shaped recess 2031a. The dot-shaped protrusion 105a is in contact with the conductive layer 2032 of the second conductive parts 203, thereby making the first conductive parts 105 electrically connected to the second conductive parts 203.

Please refer to FIG. 6, a bottom of the line-shaped recess 2031a is provided with a plurality of contact points sequentially arranged along an extension direction of the line-shaped recess 2031a (first direction) and spaced apart from each other. An area of the contact points is greater than or equal to an area of an end of the dot-shaped protrusion 105a away from the substrate 101. For example, the contact points include a first contact point A1, a second contact point A2, a third contact point A3, and a fourth contact point A4. When the dot-shaped protrusion 105a is defined in the line-shaped recess 2031a. The dot-shaped protrusion 105a may be in contact with any one of the first contact point A1, the second contact point A2, the third contact point A3, or the fourth contact point A4. As such, the line-shaped protrusion 105a may be located on many different positions in the line-shaped recess 2031a.

It should be understood that the dot-shaped protrusion 105a may also be located on other positions on the bottom of the line-shaped recess 2031a in addition to the first contact point A1, the second contact point A2, the third contact point A3, and the fourth contact point A4.

The line-shaped recess 2031a includes two first recess lateral walls 2031d opposite to each other and two second recess lateral walls 2031e opposite to each other. The two first recess lateral walls 2031d extend along an extension direction of the line-shaped recess 2031a. Each of the second recess lateral walls 2031e is connected between two first recess lateral walls 2031d. When the dot-shaped protrusion 105a is defined in the line-shaped recess 2031a, a gap is defined between the dot-shaped protrusion 105a and the first recess lateral wall 2031d of the line-shaped recess 2031a, allowing the dot-shaped protrusion 105a to be easily moved in the line-shaped recess 2031a.

It should be understood that a conductive adhesive may also be disposed between the dot-shaped protrusion 105a and the second conductive parts 203, thereby making the doted-shaped protrusion 105a electrically connected to the second conductive parts 203.

Figure 4:
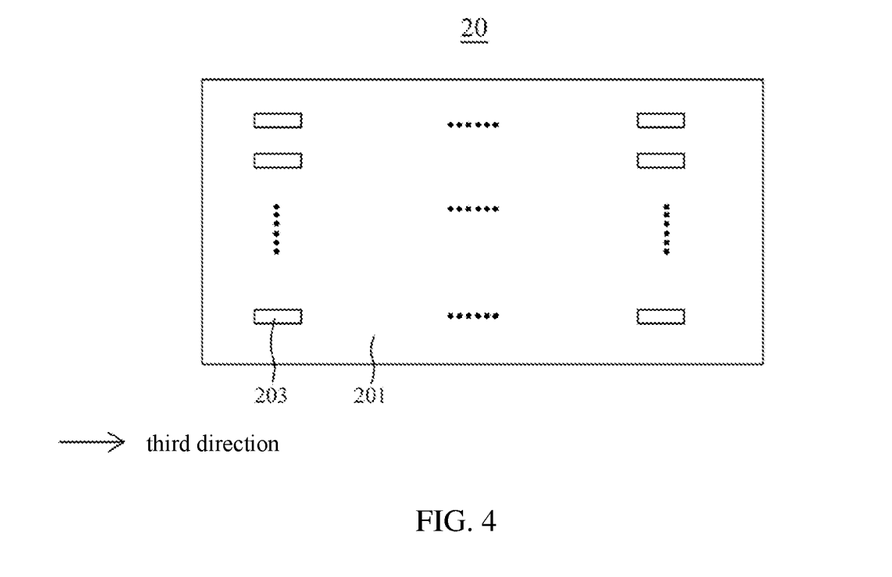
FIG. 4 is a first schematic plan view showing the driving substrate of the display device in FIG. 1.
Figure 5:
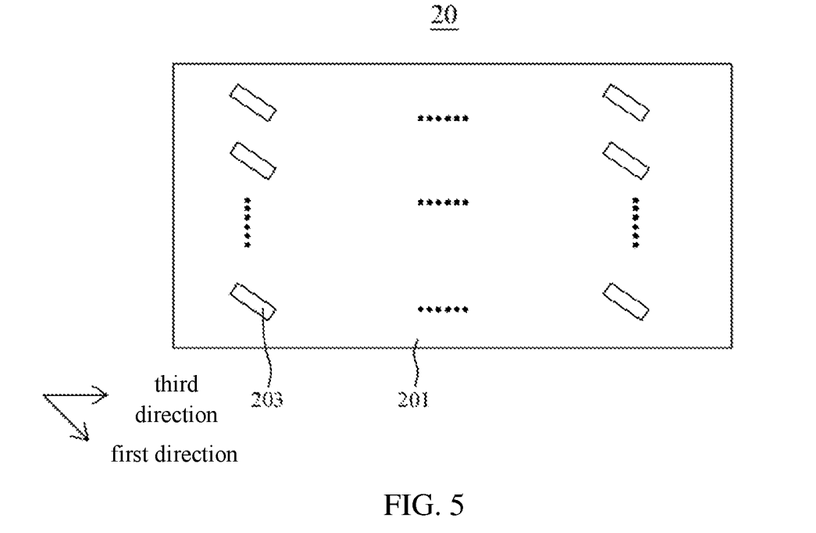
FIG. 5 is a second schematic plan view showing the driving substrate of the display device in FIG. 1.

Please refer to FIG. 4, FIG. 5, and FIG. 6, the line-shaped recess 2031a straightly extends along the first direction. The first direction is parallel to or intersects a third direction. When the first direction intersects the third direction, an inclined angle between the first direction and the third direction is greater than 0° or is less than or equal to 180°. For example, the inclined angle may be 30°, 40°, 50°, 60°, 70°, 90°, or 120°.

Deformation of the substrate 101 due to shrink or stretch along a single direction is relatively obvious. Therefore, when the first conductive parts are moved along a single direction, an extension direction of the line-shaped recess 2031a and a shifting direction of the first conductive parts 105 are same. When the shifted dot-shaped protrusion 105a of the first conductive parts 105 are moved in the line-shaped recess 2031a of the second conductive parts 203, the first conductive parts 105 can be correspondingly aligned with and conductive with the second conductive parts 203, thereby ensuring that the display device can display normally.

Multiple driving substrates 20 and multiple line-shaped recesses 2031a have a same extension direction, so that two adjacent luminescent substrates 10 spliced to each other can be aligned with each other.

An area of a cross-section of a surface of the line-shaped recess 2031a parallel to the carrier board 201 and close to the luminescent substrate is increasingly increased from a direction close to the carrier board 201 to a direction away from the carrier board 201. Therefore, the second conductive parts 203 can be stably disposed on the carrier board 201, and the dot-shaped protrusion 105a can be easily moved in the line-shaped recess 2031a.

A depth of the line-shaped recess 2031a is greater than or equal to 10 μm or is less than or equal to 100 μm. For example, the depth may be 20 μm, 40 μm, 50 μm, 60 μm, 70 μm, or 80 μm.

A size of the line-shaped recess 2031 along an extension direction of the line-shaped recess 2031 (first direction) is greater than or equal to 50 μm and is less than or equal to 200 μm. For example, the size may be 60 μm, 80 μm, 100 μm, 120 μm, 140 μm, 160 μm, 180 μm, or 200 μm. Therefore, a shifting deviation value of the first conductive parts 105 due to shrink or stretch of the substrate 101 can be adapted, thereby preventing the second conductive parts 203 occupy too much space.

Figure 7:
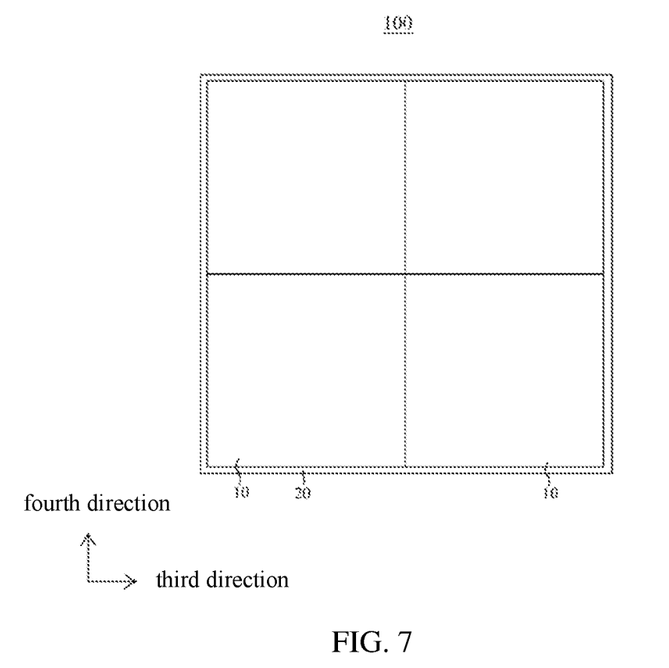
FIG. 7 is a schematic plan view showing a display device according to another embodiment of the present disclosure.

Please refer to FIG. 7. Multiple luminescent substrates 10 are spliced to each other along the third direction and a fourth direction. The third direction intersects the fourth direction. Specifically, the third direction is perpendicular to the fourth direction.

Figure 9:
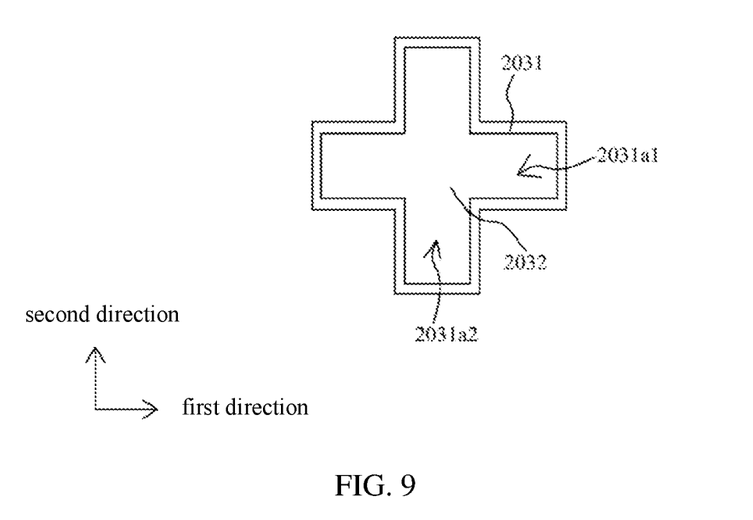
FIG. 9 is a schematic plan view showing a second conductive part of the driving substrate in FIG. 8.
Figure 11:
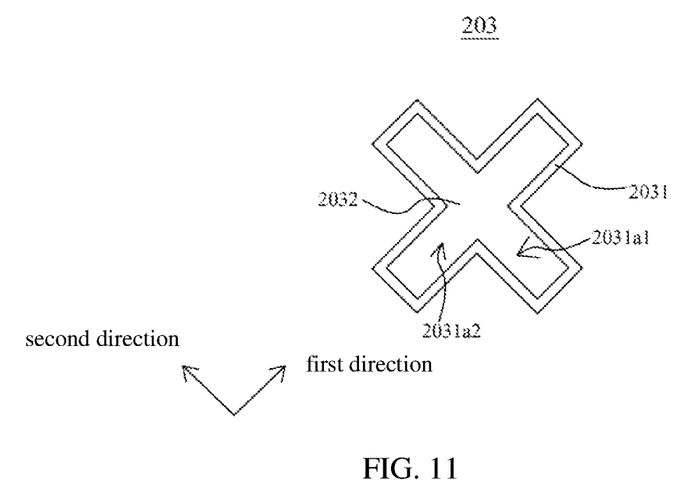
FIG. 11 is a schematic plan view showing a second conductive part of the driving substrate in FIG. 10.

Please refer to FIG. 9 and FIG. 11, the line-shaped recess of the second conductive parts 203 includes a first line-shaped recess 2031a1 and a second line-shaped recess 2031a2 intersecting the first line-shaped recess 2031a1. The first line-shaped recess 2031a1 extends along the first direction. The second line-shaped recess 2031a2 extends along the second direction. The first direction intersects the second direction. Therefore, when the first conductive parts 105 are connected to the second conductive parts, the dot-shaped protrusion 105a of the first conductive parts 105 can be moved in recesses extending along different directions, thereby ensuring that the first conductive parts can be aligned with and conductive with the second conductive parts. As such, the display device 100 can display normally.

The first line-shaped recess 2031a1 and the second line-shaped recess 2031a2 are same. For example, both the first line-shaped recess 2031a1 and the second line-shaped recess 2031a2 can be straight-line-shaped and have a same shape and a same size. The first line-shaped recess 2031a1 and the second line-shaped recess 2031a2 are same as the line-shaped recess as shown in FIG. 6, and are not described here.

Figure 8:
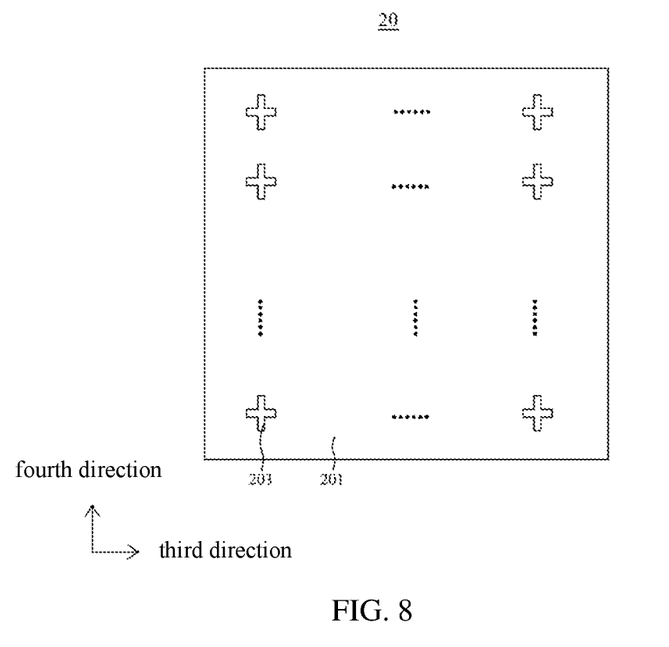
FIG. 8 is a first schematic plan view showing a driving substrate of the display device in FIG. 7.

As shown in FIG. 9, the first line-shaped recess 2031a1 and the second line-shaped recess 2031a2 intersect each other and form a crisscross shape. The first direction is perpendicular to the second direction. It should be understood that the first line-shaped recess 2031a1 and the second line-shaped recess 2031a2 may also intersect each other and form a T shape. As shown in FIG. 8, the third direction is parallel to the first direction, and the fourth direction is parallel to the second direction.

Figure 10:
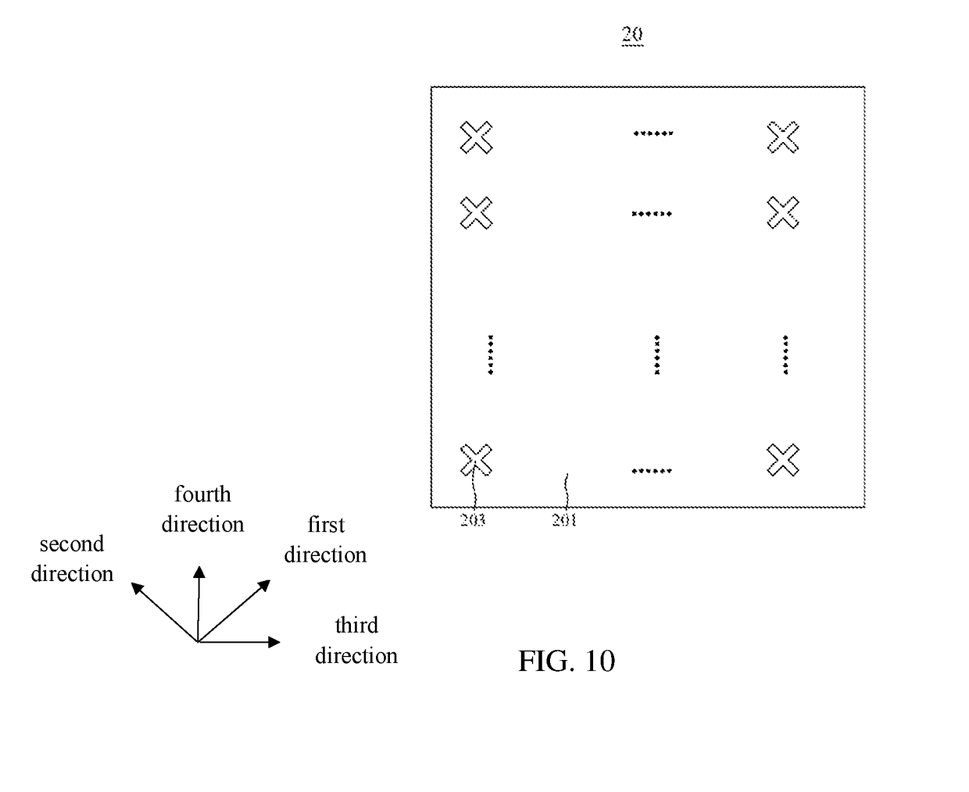
FIG. 10 is a second schematic plan view showing a driving substrate of the display device in FIG. 7.

As shown in FIG. 11, the first line-shaped recess 2031a1 and the second line-shaped recess 2031a2 intersect each other and form an X shape. An inclined angle between the first direction and the second direction is greater than 0° and is less than 90°. For example, the inclined angle may be 30°, 45°, 60°, or 80°. As shown in FIG. 10, the first direction intersects both the third direction and the fourth direction. The second direction intersects both the third direction and the fourth direction. An inclined angle between the first direction and the third direction is greater than 0° and is less than 90°. An inclined angle between the first direction and the fourth direction is greater than 0° and is less than 90°. An inclined angle between the second direction and the third direction is greater than 90° and is less than 180°. An inclined angle between the second direction and the fourth direction is greater than 0° and is less than 90°.

The description of the above embodiments is only for helping to understand the technical solution of the present disclosure and core ideas thereof, and it is understood by those skilled in the art that many changes and modifications to the described embodiments can be carried out without departing from the scope and the spirit of the disclosure that is intended to be limited only by the appended claims.

What is claimed is:

1. A display device, comprising:
   a luminescent substrate, wherein the luminescent substrate comprises a substrate, a plurality of first conductive parts, and a plurality of luminescent devices, the substrate comprises a first surface and a second surface opposite to the first surface, the luminescent devices are disposed on the first surface of the substrate, the first conductive parts are spaced apart from each other and are disposed on the second surface of the substrate, the first conductive parts are electrically connected to the luminescent devices, and the substrate is a flexible substrate; and
   a driving substrate, wherein the driving substrate is disposed on a backside of a light-emitting surface of the luminescent substrate, a surface of the driving substrate close to the luminescent substrate is provided with a driving circuit and a plurality of second conductive parts connected to the driving circuit and spaced apart from each other, and the second conductive parts are connected to the first conductive parts;
   wherein one of the first conductive parts or the second conductive parts comprise a line-shaped recess, the other one of the first conductive parts or the second conductive parts comprise a dot-shaped protrusion, the dot-shaped protrusion is defined in the line-shaped recess, and a gap is defined between the dot-shaped protrusion and a lateral wall of the line-shaped recess extending along an extension direction of the line-shaped recess.

2. The display device of claim 1, wherein the line-shaped recess extends along a single direction.

3. The display device of claim 2, wherein the plurality of luminescent substrates are spliced to each other, and the plurality of line-shaped recesses have a same extension direction.

4. The display device of claim 1, wherein the line-shaped recess comprises a first line-shaped recess and a second line-shaped recess intersecting with the first line-shaped recess, the first line-shaped recess extends along a first direction, the second line-shaped recess extends along a second direction, and the first direction intersects the second direction.

5. The display device of claim 4, wherein the first line-shaped recess and the second line-shaped recess intersect each other and form an X shape, a crisscross shape, or a T shape.

6. The display device of claim 1, wherein one of the first conductive parts or the second conductive parts comprise a frame body and a conductive layer, at least part of the conductive layer is formed on a bottom of an opening of the frame body, and the opening and the conductive layer disposed in the opening form the line-shaped recess.

7. A display device, comprising:
a luminescent substrate, wherein the luminescent substrate comprises a substrate, a plurality of first conductive parts, and a plurality of luminescent devices, the substrate comprises a first surface and a second surface opposite to the first surface, the luminescent devices are disposed on the first surface of the substrate, the first conductive parts are spaced apart from each other and are disposed on the second surface of the substrate, the first conductive parts are electrically connected to the luminescent devices, and the substrate is a flexible substrate;
a driving substrate, wherein the driving substrate is disposed on a backside of a light-emitting surface of the luminescent substrate, a surface of the driving substrate close to the luminescent substrate is provided with a driving circuit and a plurality of second conductive parts connected to the driving circuit and spaced apart from each other, and the second conductive parts are connected to the first conductive parts;
wherein one of the first conductive parts or the second conductive parts comprise a line-shaped recess, the other one of the first conductive parts or the second conductive parts comprise a dot-shaped protrusion, and the dot-shaped protrusion is defined in the line-shaped recess.

8. The display device of claim 7, wherein the line-shaped recess extends along a single direction.

9. The display device of claim 8, wherein the plurality of luminescent substrates are spliced to each other, and the plurality of line-shaped recesses have a same extension direction.

10. The display device of claim 7, wherein the line-shaped recess comprises a first line-shaped recess and a second line-shaped recess intersecting with the first line-shaped recess, the first line-shaped recess extends along a first direction, the second line-shaped recess extends along a second direction, and the first direction intersects the second direction.

11. The display device of claim 10, wherein the plurality of luminescent substrates are spliced to each other along a third direction, and one of the first direction or the second direction is parallel to the third direction.

12. The display device of claim 10, wherein the plurality of luminescent substrates are spliced to each other along a third direction and a fourth direction, the third direction intersects the fourth direction, the third direction is parallel to the first direction, and the fourth direction is parallel to the second direction.

13. The display device of claim 10, wherein the plurality of luminescent substrates are spliced to each other along a third direction and a fourth direction, the third direction intersects the fourth direction, the first direction intersects both the third direction and the fourth direction, and the second direction intersects both the third direction and the fourth direction.

14. The display device of claim 10, wherein the first line-shaped recess and the second line-shaped recess intersect each other and form an X shape, a crisscross shape, or a T shape.

15. The display device of claim 7, wherein one of the first conductive parts or the second conductive parts comprise a frame body and a conductive layer, at least part of the conductive layer is formed on a bottom of an opening of the frame body, and the opening and the conductive layer disposed in the opening form the line-shaped recess.

16. The display device of claim 15, wherein material of the frame body comprises organic material, material of the conductive layer comprises metal or transparent conductive material, and material of dot-shaped protrusion comprises organic conductive material.

17. The display device of claim 7, wherein a height of the dot-shaped protrusion is greater than or equal to 10 µm and is less than or equal to 100 µm, a depth of the line-shaped recess is greater than or equal to 10 µm or is less than or equal to 100 µm.

18. The display device of claim 7, wherein a size of the line-shaped recess along an extension direction of the line-shaped recess is greater than or equal to 50 µm or is less than or equal to 200 µm.

19. The display device of claim 7, wherein the substrate is a flexible substrate.

20. The display device of claim 7, wherein a gap is defined between the dot-shaped protrusion and a lateral wall of the line-shaped recess extending along an extension direction of the line-shaped recess.

* * * * *